(12) United States Patent
Kim et al.

(10) Patent No.: US 12,477,748 B2
(45) Date of Patent: Nov. 18, 2025

(54) VARIABLE RESISTANCE MEMORY DEVICE AND ELECTRONIC DEVICE INCLUDING THE SAME

(71) Applicant: Samsung Electronics Co., Ltd., Suwon-si (KR)

(72) Inventors: Seyun Kim, Suwon-si (KR); Jooheon Kang, Suwon-si (KR); Sunho Kim, Suwon-si (KR); Yumin Kim, Suwon-si (KR); Garam Park, Suwon-si (KR); Hyunjae Song, Suwon-si (KR); Dongho Ahn, Suwon-si (KR); Seungyeul Yang, Suwon-si (KR); Myunghun Woo, Suwon-si (KR); Jinwoo Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 407 days.

(21) Appl. No.: 18/299,403

(22) Filed: Apr. 12, 2023

(65) Prior Publication Data
US 2024/0065001 A1    Feb. 22, 2024

(30) Foreign Application Priority Data

Aug. 19, 2022   (KR) .................. 10-2022-0104269
Nov. 16, 2022   (KR) .................. 10-2022-0153995

(51) Int. Cl.
*H10B 63/00*    (2023.01)
(52) U.S. Cl.
CPC ........... *H10B 63/845* (2023.02); *H10B 63/34* (2023.02)

(58) Field of Classification Search
CPC ...... H10B 63/845; H10B 63/34; H10B 63/84; H10N 70/24; H10N 70/8265; H10N 70/8833
See application file for complete search history.

(56) References Cited

U.S. PATENT DOCUMENTS

| | | |
|---|---|---|
| 8,427,865 B2 | 4/2013 | Shima et al. |
| 8,829,590 B2 | 9/2014 | Park |
| 9,093,369 B2 | 7/2015 | Shin et al. |
| 9,142,765 B2 | 9/2015 | Yoneda et al. |
| 9,947,685 B2 | 4/2018 | Fujii et al. |
| 9,947,686 B2 | 4/2018 | Son et al. |
| 9,966,136 B2 | 5/2018 | Ogiwara et al. |
| 10,903,235 B2 | 1/2021 | Yoon et al. |

(Continued)

FOREIGN PATENT DOCUMENTS

| | | |
|---|---|---|
| KR | 10-1842759 B1 | 3/2018 |
| KR | 10-2023-0053416 A | 4/2023 |

OTHER PUBLICATIONS

Extended European Search Report dated Feb. 26, 2024 issued in European Patent Application No. 23169766.5-1212.

*Primary Examiner* — Allison Bernstein
(74) *Attorney, Agent, or Firm* — Harness, Dickey & Pierce, P.L.C.

(57) ABSTRACT

Provided area a variable resistance memory device and/or an electronic device including the same. The variable resistance memory device includes: a resistance change layer including a metal oxide having an oxygen deficient ratio greater than or equal to about 9%; a semiconductor layer on the resistance change layer; a gate insulating layer on the semiconductor layer; and a plurality of electrodes on the gate insulating layer to be apart from each other.

20 Claims, 17 Drawing Sheets

(56) References Cited

U.S. PATENT DOCUMENTS

| | | |
|---|---|---|
| 10,930,353 B1 | 2/2021 | Yoon et al. |
| 11,024,357 B1 | 6/2021 | Mizusaki et al. |
| 11,087,839 B2 | 8/2021 | Yoon et al. |
| 11,239,416 B2 | 2/2022 | Yoon et al. |
| 2014/0175360 A1 | 6/2014 | Tendulkar et al. |
| 2020/0266345 A1 | 8/2020 | Yoon et al. |
| 2021/0202833 A1 | 7/2021 | Kim et al. |
| 2021/0202840 A1 | 7/2021 | Kim et al. |
| 2021/0217473 A1 | 7/2021 | Cho et al. |
| 2022/0020437 A1 | 1/2022 | Kim et al. |
| 2022/0020818 A1 | 1/2022 | Kim et al. |
| 2022/0052259 A1 | 2/2022 | Kim et al. |
| 2022/0077235 A1 | 3/2022 | Kim et al. |
| 2022/0140234 A1 | 5/2022 | Han |
| 2022/0246679 A1 | 8/2022 | Cho et al. |
| 2022/0302380 A1 | 9/2022 | Mizusaki et al. |
| 2022/0310827 A1 | 9/2022 | Kim et al. |
| 2023/0012158 A1 | 1/2023 | Klemme et al. |
| 2023/0093892 A1 | 3/2023 | Kim et al. |
| 2023/0121581 A1* | 4/2023 | Kim ................. H10B 63/34 257/5 |
| 2024/0065000 A1 | 2/2024 | Kim et al. |
| 2024/0196763 A1* | 6/2024 | Kim ................. H10B 63/34 |

\* cited by examiner

FIG. 4

| COMPOSITION | Oxygen Deficient Ratio (%) | $V_{forming}$ (V) |
|---|---|---|
| HfOx | 2.1 | 7.4 |
| TaSiO (Si 27at%) | 6.88 | 5 |
| TaAlO (Al 35at%) | 9.91 | 3.5 |
| TaSiO (Si 12at%) | 12.13 | 1.55 |
| TaHfO (Hf 32at%) | 13.57 | 2.2 |
| TaSiO (Si 5at%) | 13.89 | 1.28 |
| TaAlO (Al 12at%) | 13.93 | 0.95 |
| TaAlO (Al 5at%) | 15.19 | 1.3 |
| TaHfO (Hf 5at%) | 15.74 | 1.5 |
| TaOx | 16.5 | 1.65 |

FIG. 6

| COMPOSITION | Oxide formation energy (kJ/mol, $O_2$) | Oxide formation energy Difference (kJ/mol, $O_2$) | $V_{forming}$ (V) |
|---|---|---|---|
| $Ta_2O_5$ | −726.34 | 4.42 | $TaO_x$: 16.5 % |
| $TaO_2$ | −721.92 | | |
| $Al_2O_3$ | −918.96 | 123.79 | $AlO_x$: 2.1 % |
| $AlO_2$ | −795.18 | | |
| $SiO_2$ | −823.71 | 79.34 | $SiO_x$: 3.1 % |
| $Si_2O_3$ | −744.36 | | |
| $HfO_2$ | −1018.96 | 34.38 | $HfO_x$: 2.1 % |
| $Hf_2O_3$ | −984.57 | | |

FIG. 7

| COMPOSITION | Oxide formation energy (kJ/mol, $O_2$) | Oxide formation energy Difference (kJ/mol, $O_2$) |
|---|---|---|
| $Mn_2O_7$ | −291.64 | 1.52 |
| $MnO_3$ | −290.12 | |
| $TiO_2$ | −846.41 | 5.12 |
| $Ti_2O_3$ | −841.29 | |
| $SnO_2$ | −406.41 | 7.12 |
| $Sn_2O_3$ | −399.29 | |
| $CrO_3$ | −437.42 | 7.37 |
| $Cr_3O_5$ | −430.04 | |
| $MoO_3$ | −473.52 | 14.30 |
| $Mo_2O_5$ | −459.22 | |
| $V_2O_5$ | −600.24 | 18.92 |
| $VO_2$ | −581.32 | |
| $Sc_2O_3$ | −1203.24 | 33.25 |
| $ScO$ | −116.99 | |
| $WO_3$ | −542.89 | 47.68 |
| $W_2O_5$ | −495.21 | |
| $Nb_2O_5$ | −744.30 | 53.71 |
| $NbO_2$ | −690.59 | |
| $La_2O_3$ | −1087.82 | 69.32 |
| $LaO$ | −1018.50 | |
| $ZrO_2$ | −988.28 | 69.86 |
| $Zr_2O_3$ | −918.43 | |

VARIABLE RESISTANCE MEMORY DEVICE AND ELECTRONIC DEVICE INCLUDING THE SAME

CROSS-REFERENCE TO RELATED APPLICATIONS

This application is based on and claims priority under 35 U.S.C. § 119 to Korean Patent Applications No. 10-2022-0104269, filed on Aug. 19, 2022, in the Korean Intellectual Property Office, and No. 10-2022-0153995, filed on Nov. 16, 2022, in the Korean Intellectual Property Office, the disclosures of each of which are incorporated by reference herein in their entirety.

BACKGROUND

Various example embodiments relate to a memory device including a variable resistance material and/or an electronic device including the memory device.

A nonvolatile memory device includes a plurality of memory cells which retain data even when power is blocked or stopped, and thus, are able to use the stored data again when power is supplied. A nonvolatile memory device may be used in one or more of a cellular phone, a digital camera, a portable digital assistant (PDA), a mobile computer device, a stationary computer device, and other devices.

Recently, research into using a three-dimensional (or vertical) NAND (or VNAND) structure in a chip for forming a next-generation neuromorphic computing platform or neural network has been conducted.

SUMMARY

Provided are a variable resistance memory device including a resistance change layer which may include many oxygen vacancies and/or an electronic device including the variable resistance memory device.

Additional aspects will be set forth in part in the description which follows and, in part, will be apparent from the description, or may be learned by practice of variously described example embodiments.

According to various example embodiments, a variable resistance memory device includes: a resistance change layer including a metal oxide including a first metal element and a second metal element, the metal oxide having an oxygen deficient ratio greater than or equal to about 9%; a semiconductor layer on the resistance change layer; a gate insulating layer on the semiconductor layer; and a plurality of electrodes on the gate insulating layer and spaced apart from each other.

A content of the first metal element with respect to an entire metal of the resistance change layer may be greater than or equal to about 50 at %.

A content of the second metal element with respect to an entire metal of the resistance change layer may be less than or equal to about 35 at %.

The first metal element may include at least one of Ta, Ti, Sn, Cr, and Mn.

The second metal element may include at least one of Hf, Al, Nb, La, Zr, Sc, W, V, and Mo.

The variable resistance change layer may further include Si.

The semiconductor layer may be configured to receive a write voltage having an absolute value less than or equal to about 4V applied thereto.

The variable resistance memory device may further include an oxide layer between the semiconductor layer and the resistance change layer.

A thickness of the oxide layer may be less than a thickness of the resistance change layer.

The variable resistance change layer may include a first resistance change layer and a second resistance change layer sequentially arranged in a direction away from the semiconductor layer, and an oxygen deficient ratio of the first resistance change layer may be greater than an oxygen deficient ratio of the second resistance change layer.

At least three of the plurality of gate electrodes may be arranged periodically, and a pitch of the at least three of the plurality of gate electrodes may be less than or equal to about 20 nm.

The variable resistance memory device may further include a pillar, wherein the resistance change layer, the semiconductor layer, and the gate insulating layer may sequentially surround the pillar in a shell shape, and the plurality of gate electrodes and an insulating element may surround the gate insulating layer in a shell shape.

The pillar may include an insulating material.

The pillar may include a conductive material.

The pillar may be configured to receive a voltage that is greater than or equal to a voltage applied to the semiconductor layer.

According to various example embodiments, a variable resistance memory device includes: a resistance change layer including silicon and including a metal oxide having an oxygen deficient ratio that is greater than or equal to about 9%; a semiconductor layer on the resistance change layer; a gate insulating layer on the semiconductor layer; and a plurality of electrodes on the gate insulating layer to be apart from each other.

The variable resistance change layer may include at least one of Ta, Ti, Sn, Cr, and Mn.

A content of silicon with respect to a sum of metals and silicon of the resistance change layer may be less than or equal to about 35 at %.

According to various example embodiments, a variable resistance memory device includes: a resistance change layer including a first metal oxide having an oxygen deficient ratio that is greater than or equal to about 9% and a second metal oxide having an oxygen deficient ratio that is less than 9%, wherein a content of the first metal oxide is greater than a content of the second metal oxide; a semiconductor layer arranged on the resistance change layer; a gate insulating layer arranged on the semiconductor layer; and a plurality of gate electrodes arranged on the gate insulating layer to be apart from each other.

A content of a metal included in the second metal oxide with respect to entire metal included in the resistance change layer may be less than or equal to about 35 at %.

BRIEF DESCRIPTION OF THE DRAWINGS

These and/or other aspects will become apparent and more readily appreciated from the following description of various example embodiments, taken in conjunction with the accompanying drawings in which:

FIG. 4 is a diagram showing a relationship between an oxygen deficient ratio and a forming voltage of a metal oxide, according to various example embodiments;

FIG. 6 is a diagram showing a relationship between an oxygen formation energy and an oxygen deficient ratio of a metal oxide, according to various example embodiments;

FIG. 7 is a diagram showing a difference in oxygen formation energy between various metal oxides, according to various example embodiments;

DETAILED DESCRIPTION

Figure 1:
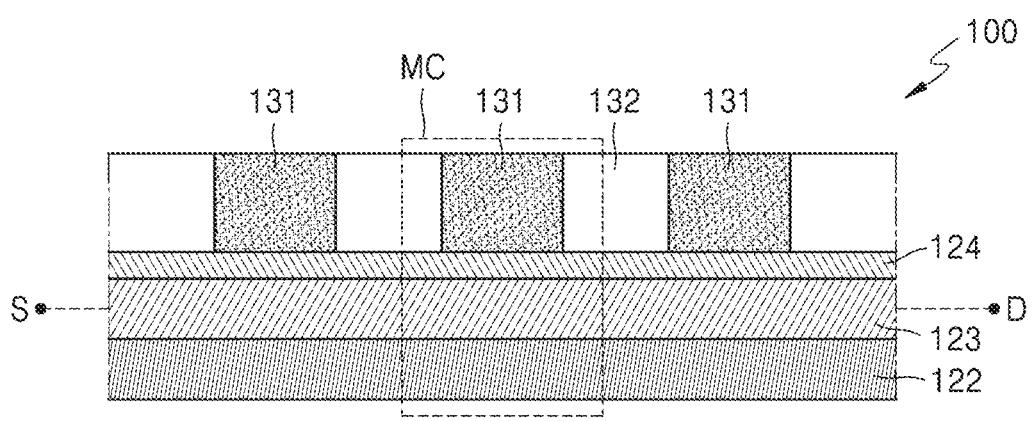
FIG. 1 is a diagram showing a schematic structure of a variable resistance memory device according to various example embodiments.

Reference will now be made in detail to various embodiments, examples of which are illustrated in the accompanying drawings, wherein like reference numerals refer to like elements throughout. In this regard, the present embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Expressions such as "in some embodiments," "according to various example embodiments," and the like, described in various parts of this specification do not necessarily refer to the same element as one another.

One or more example embodiments may be described as functional block components and various processing operations. All or part of such functional blocks may be realized by any number of hardware and/or software components configured to perform the specified functions. For example, the functional blocks of the disclosure may be implemented with one or more micro-processors or with circuit structures for certain functions. Also, for example, the functional blocks of the disclosure may be implemented with various programming or scripting languages. The functional blocks may be implemented with algorithms executed by one or more processors. Furthermore, the disclosure could employ conventional techniques for electronics configuration, signal processing and/or data control. Terms such as "mechanism," "element," "component," etc. are not limited to mechanical and physical components.

Furthermore, the connecting lines, or connectors shown in the drawings are intended to represent example functional relationships and/or physical or logical couplings between the various elements. It should be noted that many alternative or additional functional relationships, physical connections or logical connections may be present in a practical device.

Terms such as "comprise" or "include" used in this specification shall not be interpreted such that all of various components or various operations described in the specification are necessarily included. Rather, it shall be understood that some of the components or some of the operations may not be included, or additional components or operations may further be included.

Hereinafter, it will be understood that when an element is referred to as being "on" or "above" another element, the element can be directly over or under or on the right side or on the left side to the other element, or intervening elements may also be present therebetween. Hereinafter, various example embodiments will be described in detail with reference to the accompanying drawings.

Although terms such as "first," "second," etc. may be used herein to describe various elements, these terms do not limit the elements. These terms are only used to distinguish one element from another.

Hereinafter, example embodiments will be described in detail with reference to the accompanying drawings.

Figure 2:
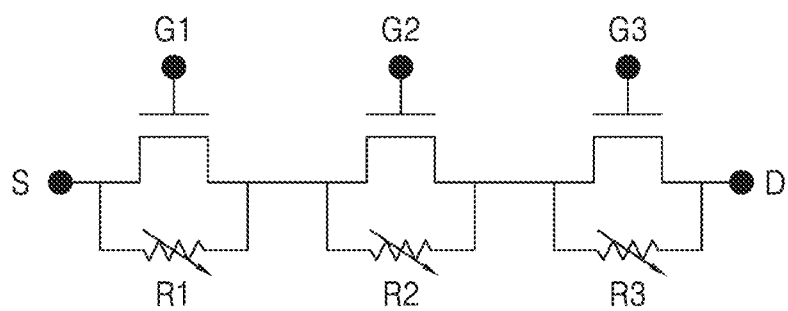
FIG. 2 is a circuit diagram, e.g. an equivalent circuit diagram of the variable resistance memory device of FIG. 1.
Figure 3:
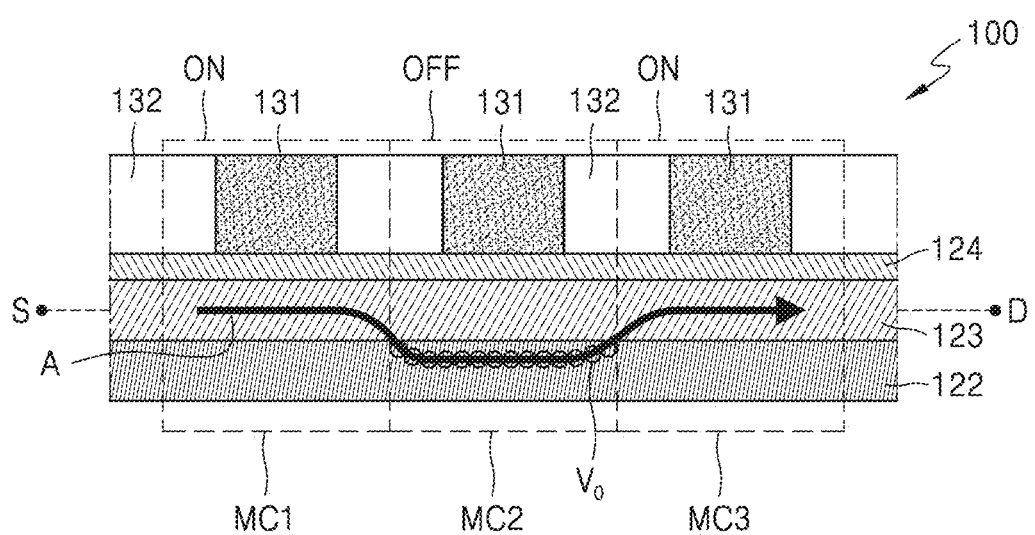
FIG. 3 is an example conceptual diagram of an operation of the variable resistance memory device of FIG. 1.

FIG. 1 is a diagram showing a schematic structure of a variable resistance memory device 100 according to various example embodiments, FIG. 2 is a circuit diagram of the variable resistance memory device 100 of FIG. 1, and FIG. 3 is an example conceptual diagram showing an operation of the variable resistance memory device 100 of FIG. 1.

Referring to FIG. 1, the variable resistance memory device 100 may include a resistance change layer 122, a semiconductor layer 123 arranged on the resistance change layer 122, a gate insulating layer 124 arranged on the semiconductor layer 123, and a plurality of gate electrodes 131 arranged on the gate insulating layer 124. An insulating element 132 for insulating the plurality of gate electrodes 131 that are adjacent to each other may further be arranged between the plurality of gate electrodes 131. However, it is only an example, and the insulating element 132 may be omitted.

The resistance change layer 122 may include a material having a resistance that varies according to an applied voltage. The resistance change layer 122 may change from a high-resistance state to a low-resistance state or from a low-resistance state to a high-resistance state according to one or more voltages applied to the gate electrodes 131.

The resistance change layer 122 may realize a range of change that is desired with a less thickness than another charge trap-based variable resistance memory devices and/or other variable resistance memory device using a phase-change material. The thickness of the resistance change layer 122 may be less than or equal to 100 nm or less than or equal to 5 nm. The thickness of the resistance change layer 122 may be greater than or equal to 1 nm.

The resistance change layer 122 may include a material having a hysteresis characteristic. For example, the resistance change layer 122 may include a metal oxide. The resistance change layer 122 may include at least two of TaOx, TiOx, SnOx, CrOx, MnOx, HfOx, AlOx, SiOx, NbOx, LaOx, ZrOx, ScOx, WOx, VOx, and MoOx.

In some example embodiments, a resistance change of the resistance change layer 122 may be a phenomenon due to oxygen vacancies. When there are many oxygen vacancies in the resistance change layer 122, a conductive filament may be formed, e.g. may be easily formed. The conductive filament may change the resistance change layer 122 to a low-resistance state so that current may flow through the resistance change layer 122, and thus, the variable resistance memory device 100 may operate, e.g. to store logical data such as logical '0' or logical '1'. When the resistance change layer 122 includes a material in which oxygen vacancies may be easily formed, the variable resistance memory device 100 may operate well, for example even when an absolute value of a voltage applied to the resistance change layer 122 or the semiconductor layer 123 is decreased. The material of the resistance change layer 122 in which oxygen vacancies may be more easily formed will be described below.

The semiconductor layer 123 may include poly-Si or polysilicon such as doped or undoped polysilicon. Materials of the semiconductor layer 123 are not limited to poly-Si. For example, various semiconductor materials, such as one or more Ge, IGZO, GaAs, and the like, may be alternatively or additionally included in the semiconductor layer 123.

A source electrode S and a drain electrode D may be connected to both ends of the semiconductor layer 123, respectively.

The gate insulating layer 124 may include various types of insulating materials. For example, silicon oxide, silicon nitride, or silicon oxynitride may be included in the gate insulating layer 124.

A voltage, e.g. the same or different voltages, for turning on/off the semiconductor layer 123 may be selectively applied to each of the plurality of gate electrodes 131.

The variable resistance memory device 100 as illustrated may have a structure in which a plurality of memory cells MC are arrayed, wherein each of the memory cells MC may have a form in which a transistor and a variable resistance are connected in parallel, as shown in an equivalent or corresponding circuit of FIG. 2.

An operation of the variable resistance memory device 100 is described below with reference to FIG. 3.

In order to select a memory cell, e.g. to select a memory cell for reading, a control logic (not shown) may perform a control operation to apply a turn-off voltage OFF to the gate electrode 131 of a specific memory cell MC2 and a turn-on voltage ON to the gate electrodes 131 of the remaining memory cells MC1 and MC2. The turn-off voltage OFF may be configured to turn off a transistor and control a current may not flow through the semiconductor layer 123 of a transistor included in the selected memory cell MC2. The turn-on voltage ON may be configured to turn on a transistor and control a current to flow through the semiconductor layer 123 of transistors included in the non-selected memory cells MC1 and MC3. Thus, the semiconductor layer 123 corresponding to the selected memory cell MC2 may have an insulating property, and the semiconductor layers 123 corresponding to the non-selected memory cells MC1 and MC3 may have a conductive property.

The turn-off voltage OFF and the turn-on voltage ON may vary according to one or more of a type, a thickness, etc. of a material included in the resistance change layer 122, the semiconductor layer 123, the gate insulating layer 124, and the gate electrodes 131. For example, when the turn-off voltage OFF is a negative voltage, the turn-off voltage OFF may be greater than or equal to about −10 V and less than or equal to about −2 V. When the turn-on voltage ON is a positive voltage, the turn-on voltage ON may be about greater than or equal to about 0 V and less than or equal to about 10 V. The turn-on voltage ON of the same value may be applied to the non-selected memory cells MC1 and MC3, and the turn-on voltages ON of different values may be applied to the non-selected memory cells MC1 and MC3.

In a write operation, when a write voltage is applied between the source electrode S and the drain electrode D, a current path may be formed as shown by arrow A, so that a resistance of the resistance change layer 122 may be changed. By using this principle, information may be stored in the resistance change layer 122. The reason that the resistance of the resistance change layer 122 is changed may be because when a current flows in the resistance change layer 122, an oxygen vacancies Vo and/or interstitial oxygen ions may be formed, and the oxygen vacancies may gather to form a conductive filament. The conductive filament formed of the oxygen vacancies may have a low resistance, and thus, the resistance of the resistance change layer 122 may be changed.

In order to use the variable resistance memory device 100, it may be desirable that there is a large difference between a resistance of a high-resistance state and a resistance of a low-resistance state of the resistance change layer 122, and to this end, it may be desirable that oxygen vacancies may be easily formed in the resistance change layer 122. In particular, desirably, oxygen vacancies may be more easily formed in the resistance change layer 122, in order to prevent or reduce deterioration of the semiconductor layer 123, by lowering an absolute value of an operating voltage, for example, a write voltage or an erase voltage, that may be applied to the variable resistance memory device 100.

The resistance change layer 122 according to various example embodiments may include a metal oxide having a high oxygen deficient ratio. For example, the resistance change layer 122 may be or may include a metal oxide having an oxygen deficient ratio greater than or equal to 9 at %. The oxygen deficient ratio may be defined by Equation 1 below.

$$\text{Oxygen Deficient Ratio} = \frac{((M1*0.5 + M2*1.0 + M3*1.5 + M4*2.0 + M5*2.5) - O)}{M1*0.5 + M2*1.0 + M3*1.5 + M4*2.0 + M5*2.5} \quad \text{[Equation 1]}$$

Here, M1, M2, M3, M4, M5, and O respectively indicate a monatomic metal element content, a bivalent metal element content, a trivalent metal element content, a tetravalent metal element content, a pentavalent metal element content, and an oxygen content.

A high oxygen deficient ratio may denote that there are relatively fewer oxygen ions compared to metal positive ions, and thus, a metal oxide having a high oxygen deficient ratio may have an increased oxygen vacancy content. When there are many oxygen vacancies in the resistance change layer 122, a resistance state of the resistance change layer may be more easily changed, and thus, the characteristics of the variable resistance memory device 100 may be improved. Alternatively or additionally, when there are many oxygen vacancies, a conductive filament may be more easily formed when a voltage is applied, and thus, a forming voltage may be decreased to decrease an operating voltage of the variable resistance memory device 100.

The resistance change layer 122 according to various example embodiments may include a binary metal oxide having an oxygen deficient ratio greater than or equal to 9% or a ternary metal oxide having an oxygen deficient ratio greater than or equal to 9%.

The binary metal oxide included in the resistance change layer 122 may include at least one of TaOx, TiOx, SnOx, CrOx, and MnOx.

The resistance change layer 122 may be or include a ternary metal oxide and may include a first metal element and a second metal element that are different from each other, and an oxygen element. A content of the first metal element may be greater than a content of the second metal element in the metal oxide. For example, the content of the first metal element with respect to the entire metal in the resistance change layer 122 may be greater than or equal to 50 at %, and the content of the second metal element with respect to the entire metal in the resistance change layer 122 may be less than or equal to 35 at %. The first metal element may include one of Ta, Ti, Sn, Cr, and Mn, and the second metal element may include one of or at least one of Hf, Al, Nb, La, Zr, Sc, W, V, and Mo.

Alternatively or additionally, the resistance change layer 122 may be or may include a ternary metal oxide and may include a metal element, a silicon element, and an oxygen element. A content of the metal element may be greater than a content of the silicon element in the resistance change layer 122. The content of the metal element with respect to a sum of the metal element and the silicon element in the resistance change layer 122 may be greater than or equal to 50 at %, and the content of the silicon element with respect to the sum of the metal element and the silicon element in the resistance change layer 122 may be less than or equal to 35 at %. The metal element may include one of or at least one of Ta, Ti, Sn, Cr, and Mn.

Alternatively or additionally, the resistance change layer 122 may include a first metal oxide having an oxygen deficient ratio greater than or equal to 9% and a second metal oxide having an oxygen deficient ratio less than 9%. A content of the first metal oxide may be greater than a content of the second metal oxide. A metal content of the first metal oxide with respect to the entire metal content of the resistance change layer 122 may be greater than or equal to 50 at %, and a metal content of the second metal oxide with respect to the entire metal content of the resistance change layer 122 may be less than or equal to 35 at %. The first metal oxide may include at least one of TaOx, TiOx, SnOx, CrOx, and MnOx. The second metal oxide may include at least one of HfOx, AlOx, SiOx, NbOx, LaOx, ZrOx, ScOx, WOx, VOx, and MoOx.

FIG. 4 is a diagram showing a relationship between an oxygen deficient ratio and a forming voltage of a metal oxide, according to various example embodiments. Referring to FIG. 4, hafnium oxide (HfOx), which is a binary oxide, may have an oxygen deficient ratio that is low as about 2.1%, and may have a forming voltage Vforming that is high as about 7.4 V. HfOx is a representative variable resistance material, but has a high forming voltage, and thus, when HfOx is applied to the variable resistance memory device 100, the semiconductor layer 123 of the variable resistance memory device 100 may be deteriorated.

Tantalum oxide (TaOx) may have an oxygen deficient ratio that is high as about 16.5% and a forming voltage Vforming that is low as about 1.65 V. It may be predicted that the variable resistance memory device 100 may be realized to have a low operating voltage, when TaOx is used as the material of the resistance change layer 122 according to various example embodiments.

Although HfOx may not be solely used as the material of the resistance change layer 122 because of its low oxygen deficient ratio, HfOx may be used as a material of the resistance change layer 122 with Ta having a high oxygen deficient ratio. As illustrated in FIG. 4, the oxygen deficient ratio and the forming voltage may vary according to types of materials included in a metal oxide. For example, while an oxygen deficient ratio of TaSiO having a silicon content of 12 at % may be about 12.13% and a forming voltage of TaSiO may be about 1.55 V, an oxygen deficient ratio of TaAlO having an aluminum content of 12 at % may be about 13.92% and a forming voltage of TaAlO may be about 0.95 V. When TaOx includes more aluminum than silicon, it may be identified that the oxygen deficient ratio may increase, and the forming voltage may decrease. Generally, as the oxygen deficient ratio increases, the forming voltage may decrease.

When the resistance change layer 122 includes a metal oxide including a plurality of different metals, the forming voltage may vary according to a content ratio of the metals. For example, when an aluminum content with respect to the entire metal of TaAlO is 5 at %, the forming voltage of TaAlO may be about 1.5 V, and when the aluminum content with respect to the entire metal of TaAlO is 12 at %, the forming voltage of TaAlO may be about 0.95 V. It may be identified that when the aluminum content is increased, the forming voltage may be reduced. However, the forming voltage of TaAlO having an aluminum content of 35 at % is about 3.5 V, and thus, it is identified that when the aluminum content is too high, the forming voltage may be increased.

The resistance change layer 122 according to various example embodiments may include a first metal element and a second metal element which are different from each other, and may include an oxygen deficient ratio greater than or equal to 9%. A content of the first metal element may be greater than a content of the second metal element in a metal oxide. Alternatively, the content of the first metal element with respect to the entire metal in the resistance change layer 122 may be greater than or equal to 50 at %, and the content of the second metal element with respect to the entire metal in the resistance change layer 122 may be less than or equal to 35 at %. The first metal element may include one of or at least one of Ta, Ti, Sn, Cr, and Mn, and the second metal element may include one of or at least one of Hf, Al, Nb, La, Zr, Sc, W, V, and Mo.

From another perspective, the resistance change layer 122 may have a metal oxide having a high oxygen deficient ratio as a matrix, and may be doped with a metal or a metal oxide having a low oxygen deficient ratio, to reduce the forming voltage. However, when the content of the doped metal or metal oxide is too high, the forming voltage may be rather increased, and thus, the content of the doped metal with respect to the entire metal in the resistance change layer 122 may be less than or equal to about 35 at %.

An absolute value of an operating voltage, for example, a write voltage or an erase voltage, of the variable resistance memory device 100 according to various example embodiments may be less than or equal to about 4 V. Alternatively, the absolute value of the write voltage or the erase voltage of the variable resistance memory device 100 according to various example embodiments may be less than or equal to about 2 V.

Figure 5:
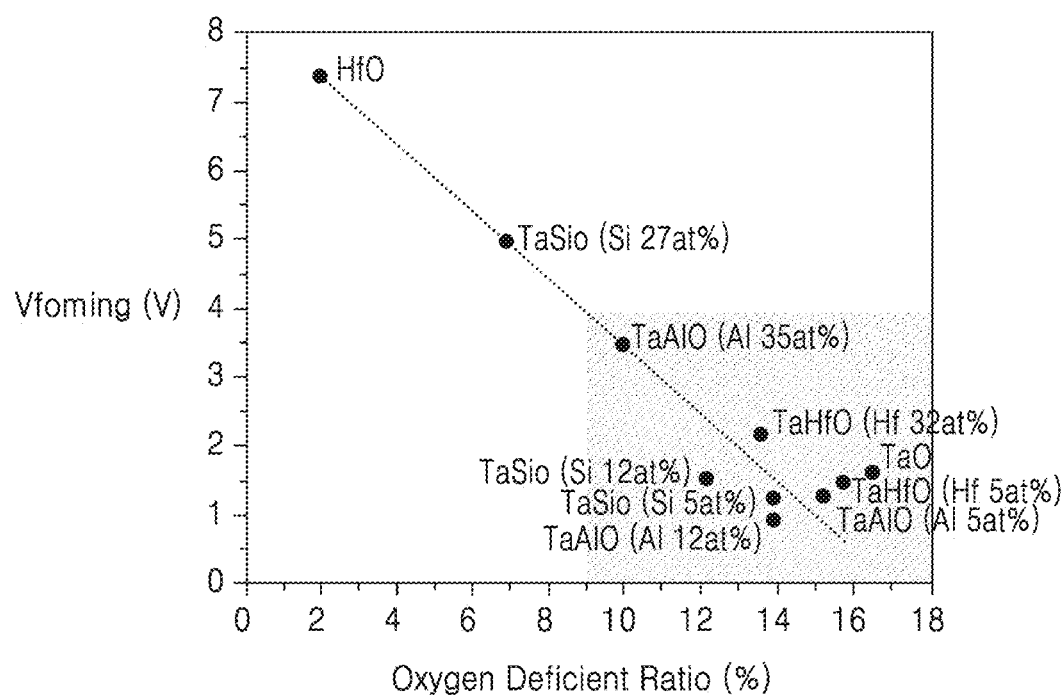
FIG. 5 is a diagram showing a relationship between an oxygen deficient ratio and a forming voltage of a metal oxide, according to various example embodiments.

FIG. 5 is a diagram showing a relationship between an oxygen deficient ratio and a forming voltage of a metal oxide, according to various example embodiments. Referring to FIG. 5, it may be identified that as the oxygen deficient ratio increases, the forming voltage may decrease. However, the relationship between the oxygen deficient ratio and the forming voltage may be approximately inversely proportionate and may not be completely inversely proportionate. Types and/or contents of metal oxides of the resistance change layer 122 may be appropriately adjusted to reduce the forming voltage.

The oxygen deficient ratio of the metal oxide may be in connection with a difference in oxygen formation energy between a plurality of metal oxides having different atomic values of the same metal.

FIG. 6 is a diagram showing a relationship between an oxygen formation energy and an oxygen deficient ratio of a metal oxide, according to various example embodiments. Referring to FIG. 6, a difference in oxygen formation energy between multiple tantalum oxides having different atomic values, for example, Ta2O5 and TaO2, may be about 4.42 kJ/mol, which is relatively small. However, the oxygen deficient ratio of the plurality of tantalum oxides may be about 16.5%, which is relatively large. However, while a difference in oxygen formation energy between aluminum oxides is about 123.79, which is relatively large, the oxygen deficient ratio of the aluminum oxides may be about 2.1%, which is relatively small. It may be identified that the difference in oxygen formation energy between metal oxides may be inversely proportional to the oxygen deficient ratio.

Although the oxygen deficient ratio of AlOx and the oxygen deficient ratio of HfOx are the same as about 2.1%, the difference in oxygen formation energy with respect to AlOx is about 123.79 kJ/mol, which is greater than the difference in oxygen formation energy with respect to HfOx that is about 34.38 kJ/mol. For example, even when the oxygen deficient ratio may be the same as each other, the difference in oxygen formation energy may be different from each other. Thus, according to various example embodiments, a metal oxide having the difference in oxygen formation energy greater than or equal to about 10 kJ/mol may be used as a matrix of the resistance change layer 122, and a metal oxide or a metal having the difference in oxygen formation energy less than about 10 kJ/mol may be used as a dopant of the resistance change layer 122.

FIG. 7 is a diagram showing a difference in oxygen formation energy with respect to various metal oxides, according to various example embodiments. Referring to FIG. 7, the difference in oxygen formation energy with respect to MnOx, TiOx, SnOx, and CrOx may be less than 10 kJ/mol. The MnOx, TiOx, SnOx, and CrOx may be used as a dopant of the resistance change layer 122 according to various example embodiments.

The difference in oxygen formation energy with respect to MoOx, VOx, ScOx, WOx, LaOx, and ZrOx may be greater than or equal to 10 kJ/mol. The MoOx, VOx, ScOx, WOx, LaOx, and ZrOx may be used as a matrix of the resistance change layer 122 according to various example embodiments.

Figure 8A:
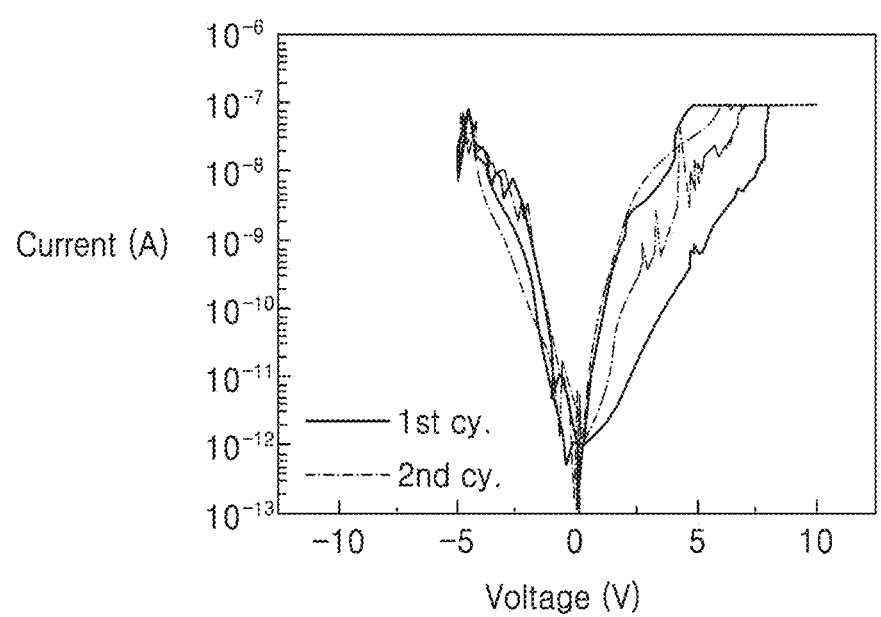
FIG. 8A is a diagram showing the characteristic IV of a variable resistance memory device using hafnium oxide as a resistance change layer.
Figure 8B:
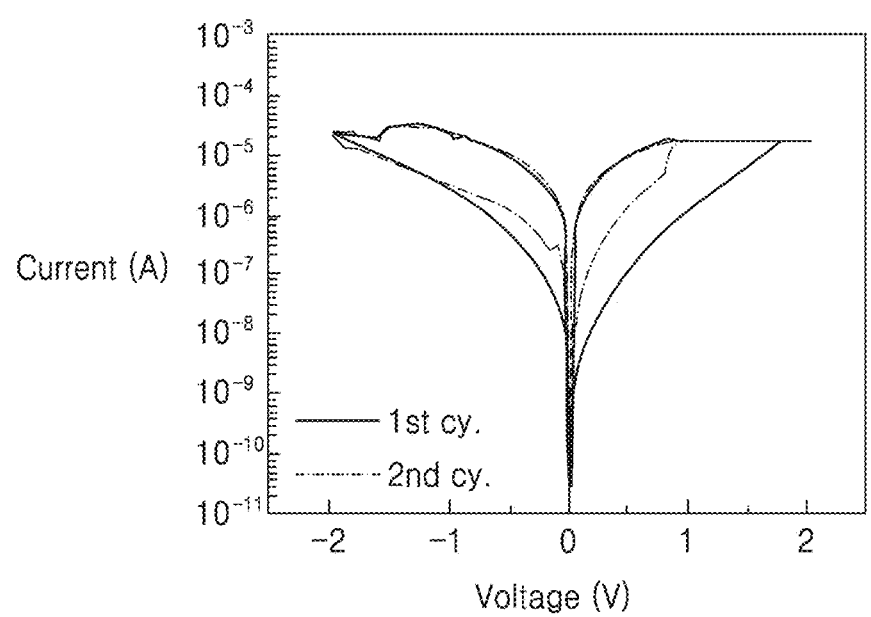
FIG. 8B is a diagram showing the characteristic IV of a variable resistance memory device using tantalum oxide as a resistance change layer.

FIG. 8A is a diagram showing the current-voltage (IV) characteristics of a variable resistance memory device using HfOx as a resistance change layer, and FIG. 8B is a diagram showing the IV characteristics of a variable resistance memory device using TaOx as a resistance change layer. The variable resistance memory device including HfOx may have the absolute value of a forming voltage that is about 7 V to about 8 V, as illustrated in FIG. 8A. As described above, the oxygen deficient ratio of HfOx may be relatively low as about 2.1%.

The variable resistance memory device including TaOx may have the absolute value of a forming voltage that is less than about 2V, as illustrated in FIG. 8B. As described above, the oxygen deficient ratio of TaOx may be relatively high as about 16.5%. This may indicate that as the oxygen deficient ratio increases, more oxygen vacancies may be formed in the resistance change layer 122, and thus, a conductive filament may be easily formed at a low operating voltage.

Figure 9:
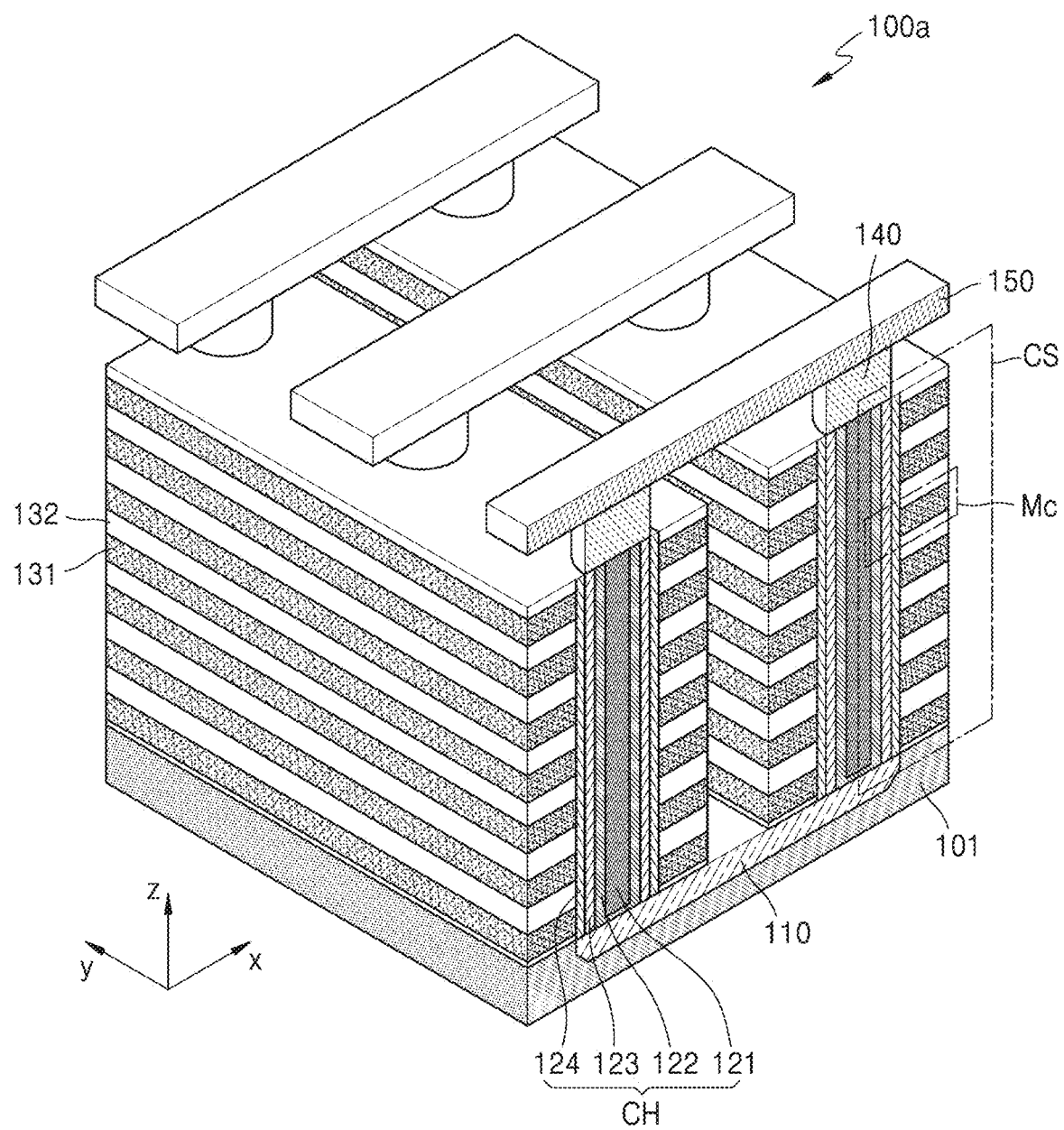
FIG. 9 is a structural diagram of a variable resistance memory device according to various example embodiments.
Figure 10:
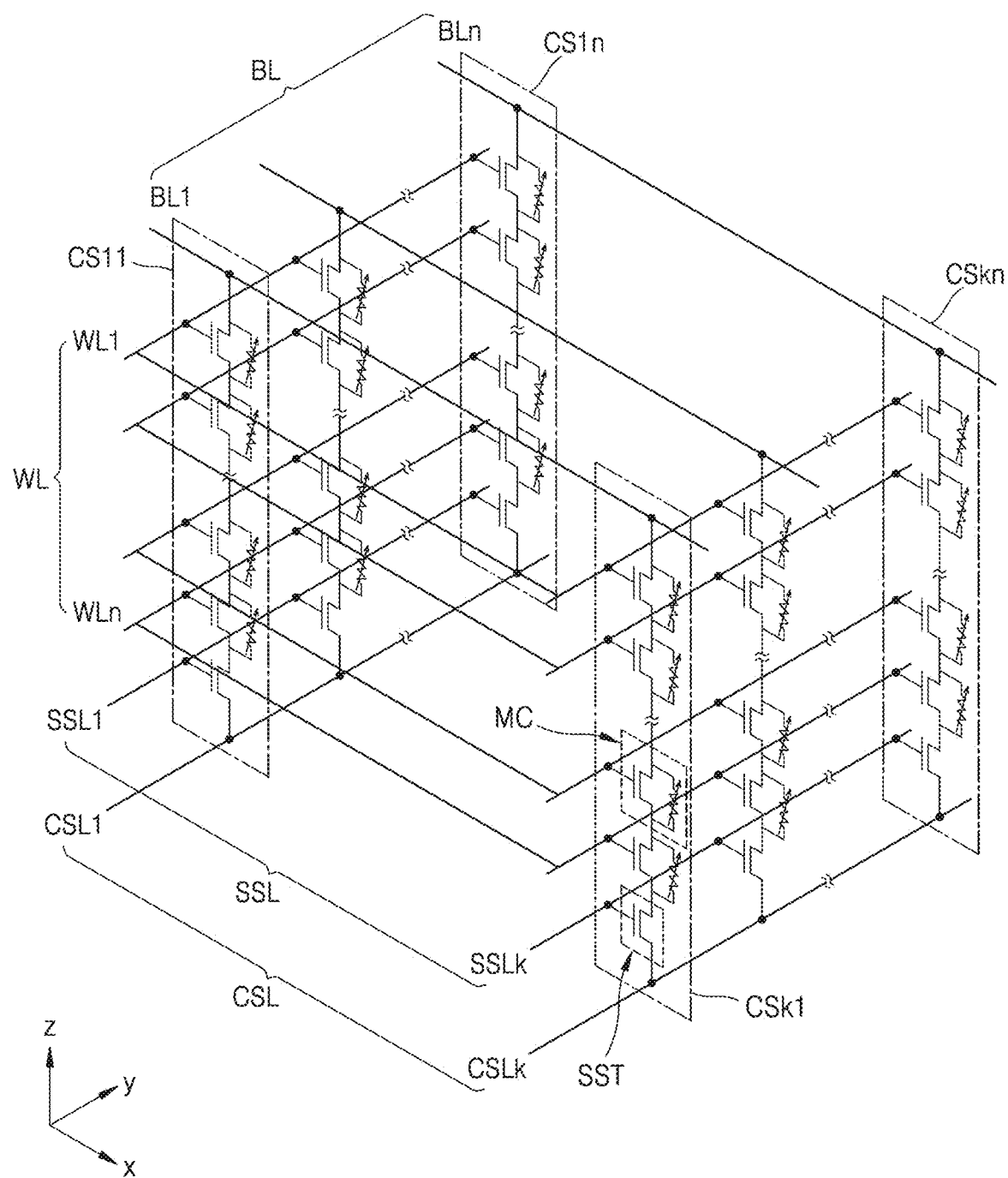
FIG. 10 is a circuit diagram, e.g. an equivalent circuit diagram of the variable resistance memory device of FIG. 9.

FIG. 9 is a structural diagram of a variable resistance memory device 100a according to various example embodiments, and FIG. 10 is a circuit diagram of the variable resistance memory device 100a of FIG. 9.

The variable resistance memory device 100a according to various example embodiments may correspond to a vertical NAND (VNAND) memory in which a plurality of memory cells MC including a variable resistance material are vertically arrayed.

Referring to FIG. 9, a plurality of cell strings CS may be formed on a substrate 101.

The substrate 101 may include a silicon material doped with a first-type impurity. For example, the substrate 101 may include a silicon material doped with a p-type impurity. For example, the substrate 101 may include a p-type well (for example, a pocket p well). Hereinafter, it is assumed that the substrate 101 includes p-type silicon. However, the substrate 101 is not limited to p-type silicon.

A doped area 110, which is a source area, may be provided on the substrate 101. The doped area 110 may include an n-type area, which is different from the substrate 101. Hereinafter, it is assumed that the doped area 110 includes an n-type area. However, the doped area 110 is not limited to the n-type area. The doped area 110 may be connected to a common source line CSL.

With K and n integers, K*n cell strings CS may be provided as indicated in the equivalent circuit diagram of FIG. 10 and may be arranged in the matrix form. The cell strings CS may be referred to as CSij (1≤i≤k, 1≤j≤n) according to a location of a column and a row. Each cell string CSij may be connected to a bit line BL, a string selection line SSL, a word line WL, and the common source line CSL.

Each cell string CSij may include the memory cells MC and a string selection transistor SST. The memory cells MC and the string selection transistor SST of each cell string CSij may be stacked in a height direction.

Rows of the plurality of cell strings CS may be connected to different string selection lines SSL1 through SSLk, respectively. For example, the string selection transistors SST of the cell strings CS11 through CS1n may be commonly connected to the string selection line SSL1. The string selection transistors SST of the cell strings CSk1 through CSkn may be commonly connected to the string selection line SSLk.

Columns of the plurality of cell strings CS may be connected to different bit lines BL1 through BLn, respectively. For example, the memory cells and the string selection transistors SST of the cell strings CS11 through CSk1 may be commonly connected to the bit line BL1, and the memory cells MC and the string selection transistors SST of the cell strings CS1n through CSkn may be commonly connected to the bit line BLn.

Rows of the plurality of cell strings CS may be connected to different common source lines CSL1 through CSLk, respectively. For example, the string selection transistors SST of the cell strings CS11 through CS1n may be commonly connected to the common source line CSL1, and the string selection transistors SST of the cell strings CSk1 through CSkn may be commonly connected to the common source line CSLk.

Gate electrodes 131 of the memory cells MC located in the same height from the substrate 101 or the string selection transistors SST may be commonly connected to one word line WL. Also, gate electrodes 131 of the memory cells MC located in different heights from the substrate 520 or the string selection transistors SST may be connected to different word lines WL1 through WLm, respectively.

The illustrated circuit structure is an example. For example, the number of rows of the cell strings CS may increase or decrease. When the number of rows of the cell strings CS is changed, the number of string selection lines connected to the rows of the cell strings CS and the number of cell strings CS connected to one bit line may also be changed. When the number of rows of the cell strings CS is changed, the number of common source lines connected to the rows of the cell strings CS may also be changed.

The number of columns of the cell strings CS may also increase or decrease and is not limited to FIG. 9. When the number of columns of the cell strings CS is changed, the number of bit lines connected to the columns of the cell strings CS and the number of cell strings CS connected to one string selection line may also be changed.

The height of the cell strings CS may also increase or decrease and is not limited to FIG. 9. For example, the number of memory cells MC stacked in each of the cell strings CS may increase or decrease. When the number of memory cells MC stacked in each cell string CS is changed, the number of word lines WL may also be changed. For example, the number of string selection transistors included in each cell string CS may increase. When the number of string selection transistors included in each cell string CS is changed, the number of string selection lines or the common source lines may also be changed. When the number of string selection transistors SSTs is increased, the string selection transistors SSTs may be stacked in a shape that is the same as the shape in which the memory cells MC are stacked.

For example, a writing operation and a reading operation may be performed for each row of the cell strings CS. The cell strings CS may be selected for each row by the common source line CSL, and the cell strings CS may be selected for each row by the string selection lines SSL. Also, a voltage may be applied to the common source lines CSL by a unit of at least two common source lines. A voltage may be applied to the common source lines CSL by a unit of the entire common source lines CSL.

The writing operation and the reading operation may be performed for each page in a selected row of the cell strings CS. A page may correspond to one row of the memory cells connected to one word line WL. The memory cells may be selected for each page by the word lines WLs, in a selected row of the cell strings CSs.

As illustrated in FIG. 9, the cell string CS may include a channel hole CH having a cylindrical shape and the plurality of gate electrodes 131 and a plurality of insulating elements 132 surrounding the channel hole CH in a ring shape. The plurality of insulating elements 132 may be provided to isolate between the plurality of gate electrodes 131. The plurality of gate electrodes 131 and the plurality of insulating elements 132 may be alternately stacked in a vertical direction (a z direction). The channel hole CH having the cylindrical shape may include an insulating pillar 121 having a cylindrical shape extending in a vertical direction and the resistance change layer 122, the semiconductor layer 123, and the gate insulating layer 124 having a shape sequentially surrounding the insulating pillar 121 in a cylindrical shell shape.

The gate electrodes 131 may include a metal material, and/or a silicon material doped in a high concentration. Each gate electrode 131 may be connected to either of a word line WL and a string selection line SSL.

The insulating elements 132 may include various insulating materials, such as one or more of silicon oxide, silicon nitride, or the like.

The channel hole CH may include a plurality of layers. The outermost layer of the channel hole CH may be the gate insulating layer 124. For example, the gate insulating layer 124 may include various insulating materials, such as one or more of silicon oxide, silicon nitride, silicon oxynitride, or the like. The gate insulating layer 124 may be conformally deposited on the channel hole CH.

The semiconductor layer 123 may be conformally deposited along an inner surface of the gate insulating layer 124. The semiconductor layer 123 may include a semiconductor material doped with a first-type material. The semiconductor layer 123 may include a silicon material doped with a material of the same-type as the substrate 101. For example, when the substrate 101 includes a p-type doped silicon material, the semiconductor layer 123 may also include a p-type doped silicon material. Alternatively or additionally, the semiconductor layer 123 may include materials, such as one or more of Ge, IGZO, GaAs, etc.

The resistance change layer 122 may be arranged along an inner surface of the semiconductor layer 123. The resistance change layer 122 may be arranged to contact the semiconductor layer 123 and may be conformally deposited on the semiconductor layer 123.

The resistance change layer 122 may be changed to a high-resistance state or a low-resistance state according to an applied voltage and may include a metal oxide having a high oxygen deficient ratio.

The resistance change layer 122 may have substantially the same materials and characteristics as the resistance change layer 122 described above. The resistance change layer 122 may include a binary metal oxide having an oxygen deficient ratio greater than or equal to 9% or a ternary metal oxide having an oxygen deficient ratio greater than or equal to 9%.

The binary metal oxide included in the resistance change layer 122 may be or include at least one of TaOx, TiOx, SnOx, CrOx, and MnOx.

The ternary metal oxide included in the resistance change layer 122 may include a first metal element and a second metal element that are different from each other, and an oxygen element. A content of the first metal element may be greater than a content of the second metal element in the metal oxide. For example, the content of the first metal element with respect to the entire metal in the resistance change layer 122 may be greater than or equal to 50 at %, and the content of the second metal element with respect to the entire metal in the resistance change layer 122 may be less than or equal to 35 at %. The first metal element may include one of or at least one of Ta, Ti, Sn, Cr, and Mn, and the second metal element may include one of or at least one of Hf, Al, Nb, La, Zr, Sc, W, V, and Mo.

A content of the metal element may be greater than a content of the silicon element in the resistance change layer 122. The content of the metal element with respect to the sum of the metal element and the silicon element in the resistance change layer 122 may be greater than or equal to 50 at %, and the content of the silicon element with respect to the sum of the metal element and the silicon element in the resistance change layer 122 may be less than or equal to 35 at %. The metal element may include one of or at least one of Ta, Ti, Sn, Cr, and Mn.

Alternatively, the resistance change layer 122 may include a first metal oxide having an oxygen deficient ratio greater than or equal to 9% and a second metal oxide having an oxygen deficient ratio less than 9%. A content of the first metal oxide may be greater than a content of the second metal oxide. A metal content of the first metal oxide with respect to the entire metal content of the resistance change layer 122 may be greater than or equal to 50 at %, and a metal content of the second metal oxide with respect to the entire metal content of the resistance change layer 122 may be less than or equal to 35 at %. The first metal oxide may be or include at least one of TaOx, TiOx, SnOx, CrOx, and MnOx. The second metal oxide may be or include at least one of HfOx, AlOx, SiOx, NbOx, LaOx, ZrOx, ScOx, WOx, VOx, and MoOx.

The variable resistance memory device 100a may include the resistance change layer 122 in which oxygen vacancies may be easily formed, and thus, a difference between a resistance value of a high-resistance state and a resistance value of a low-resistance state may be increased, and the characteristics of a low set voltage and a low reset voltage may be realized.

The insulating pillar 121 may be deposited along an inner surface of the resistance change layer 122. The insulating pillar 121 may fill the innermost space of the channel hole CH.

The resistance change layer 122 and the semiconductor layer 123 may contact the doped area 110, that is, the common source area.

A drain area 140 may be arranged in the channel hole CH of the cell string CS. The drain area 140 may include a second-type doped silicon material. For example, the drain area 140 may include a silicon material doped with an n-type material.

A bit line 150 may be provided on the drain area 140. The drain area 140 and the bit line 150 may be connected to each other via contact plugs.

Each gate electrode 131 and the gate insulating layer 124, the semiconductor layer 123, and the resistance change layer 122 facing the gate electrode 131 in a horizontal direction (an x direction) may form the memory cell MC. For example, the memory cell MC may have a circuit structure in which a transistor including the gate electrode 131, the gate insulating layer 124, and the semiconductor layer 123 is connected in parallel with a variable resistance due to the resistance change layer 122.

The parallel connection structure may be continually arranged in the vertical direction (the z direction) to form the cell string CS. Also, both ends of the cell string CS may be connected to the common source line CSL and the bit line BL as illustrated in the circuit diagram of FIG. 10. By applying a voltage to the common source line CSL and the bit line BL, programming, reading, and erasing may be performed on a plurality of memory cells MC.

For example, when a memory cell MC on which a program operation is to be performed is selected, a gate voltage value of the selected cell may be adjusted such that the selected cell is in a channel-off state, and a gate voltage value of non-selected cells may be adjusted such that the non-selected cells are in a channel-on state. Accordingly, a current path due to the voltage applied to the common source line CSL and the bit line BL may pass through an area of the resistance change layer 122 of the selected memory cell MC. Here, the applied voltage may be set as Vset or Vreset to form an LRS or an HRS and to write data of logical "1" or logical "0" in the selected memory cell MC as desired.

With respect to a read operation, reading may be performed on a selected cell according to a similar method. For example, a gate voltage applied to each gate electrode 131 may be adjusted such that a selected memory cell MC is in a channel-off state and non-selected memory cells MC are in a channel-on state. Then, a current flowing through the corresponding cell MC due to an applied voltage Vread between the common source line CSL and the bit line BL may be measured to identify a cell state, e.g. logical"1" or logical "0".

As described above, according to the variable resistance memory device 100a according to various example embodiments, the memory cell MC may be formed by using the resistance change layer 122 including a material for easily forming a conductive filament based on oxygen vacancies, and the memory cells MC may be arrayed to form the memory device. Thus, compared to other structures, for example, a phase-change material-based memory device or a charge-trap-based memory device, the resistance change layer 122 may be formed to have a decreased thickness, and the variable resistance memory device 100a may have a low operating voltage. For example, the variable resistance memory device 100a may have an operating voltage, for example, a write voltage or an erase voltage, an absolute value of which is less than or equal to about 4 V. Alternatively, the variable resistance memory device 100a may have an operating voltage, for example, a write voltage or an erase voltage, an absolute value of which is less than or equal to about 2 V.

In a VNAND structure, due to a packaging feature or limit according to a height of the cell string CS, there is a limit to increase the number of gate electrodes 131 included in the cell string CS. Moreover, in the case of a charge-trap based memory device, there may be a limit to reduce a distance between adjacent gate electrodes 131 due to interference. For example, it may be difficult to reduce a pitch of gate electrodes adjacent to each other in the vertical direction (the z direction) to be less than or equal to about 38, and thus, there is a limit of the memory capacity.

The variable resistance memory device 100a according to various example embodiments may use the resistance change layer 122 described above, and thus, may reduce or minimize a pitch between the gate electrodes 131, e.g. a pitch of at least three of the gate electrodes 131 which may be arranged in a periodic manner. According to various example embodiments, the pitch may be reduced to be less than or equal to 20 nm, for example, to be about 15 nm, and in this case, the memory capacity may be increased two times or more.

Based on this structure, the variable resistance memory device 100a may address or at least partly address a scaling issue between the memory cells in next-generation VNAND memories, to increase the density and/or to realize low power consumption.

Figure 11:
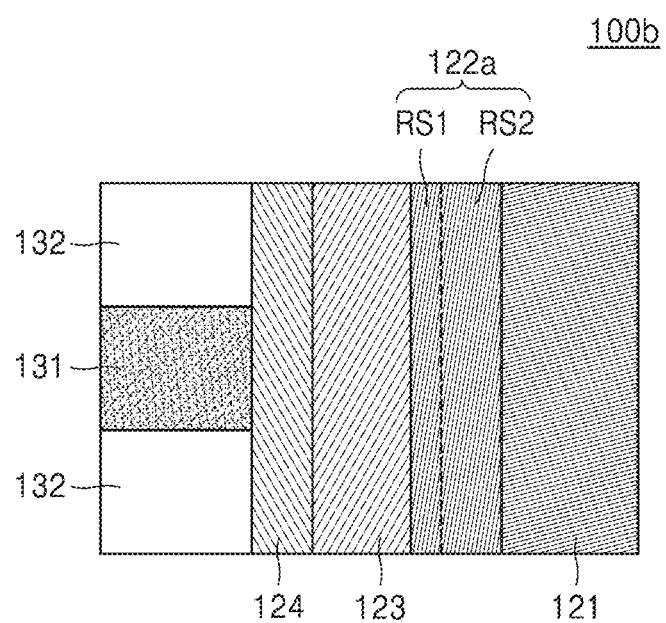
FIG. 11 is a diagram showing a portion of a variable resistance memory device including a plurality of resistance change layers, according to various example embodiments.

FIG. 11 is a diagram of a portion of a variable resistance memory device 100b including a plurality of resistance change layers 122 according to various example embodiments. Referring to FIGS. 9 and 11, the variable resistance memory device 100b of FIG. 11 may include a plurality of resistance change layers 122a. For example, the resistance change layers 122a may include a first resistance change layer RS1 and a second resistance change layer RS2 sequentially arranged in a direction away from the semiconductor layer 123.

At least one of the first and second resistance change layers RS1 and RS2 may include a metal oxide having an oxygen deficient ratio greater than or equal to 9%. For example, the first resistance change layer RS1 may include a first metal oxide having an oxygen deficient ratio greater than or equal to 9% as a matrix and may be doped with a second metal oxide having an oxygen deficient ratio less than 9%. The oxygen deficient ratio of the first metal oxide included in the first resistance change layer RS1 may be greater than an oxygen deficient ratio of a first metal oxide included in the second resistance change layer RS2. Oxygen vacancies may be easily or more easily formed in the first resistance change layer RS1 adjacent to the semiconductor layer 123, and thus, an operating voltage of the variable resistance memory device 100 may be reduced.

Figure 12:
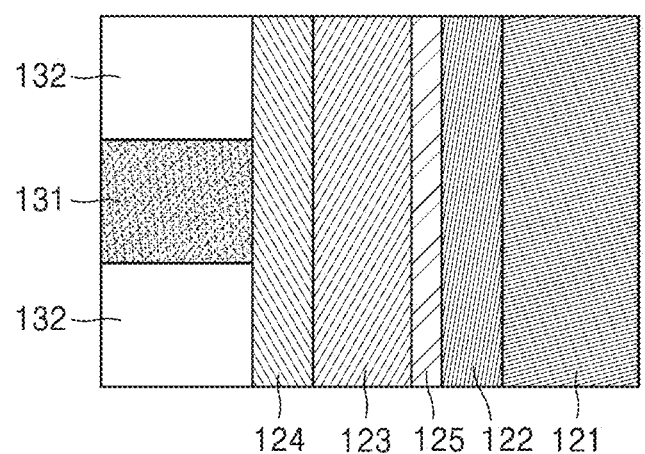
FIG. 12 is a diagram showing a portion of a variable resistance memory device further including an oxide layer, according to various example embodiments.

FIG. 12 is a diagram of a portion of a variable resistance memory device 100c further including an oxide layer 125, according to various example embodiments. Referring to FIGS. 9 and 12, the variable resistance memory device 100c of FIG. 12 may further include the oxide layer 125 between the semiconductor layer 123 and the resistance change layer 122. The oxide layer 125 may include silicon oxide, but is not limited thereto. The oxide layer 125 may include an oxide of a material contacting the oxide layer 125, for example, an oxide of a material included in the semiconductor layer 123, in a device implementing the variable resistance memory device 100c. A thickness of the oxide layer 125 may be less than a thickness of the resistance change layer 122. For example, the thickness of the oxide layer 125 may be less than or equal to about 5 nm.

Figure 13:
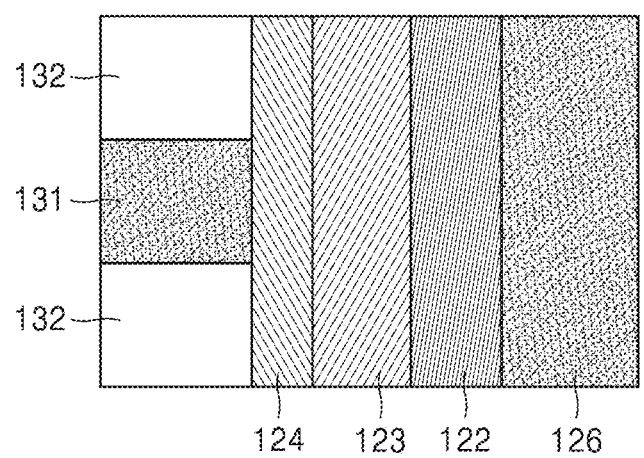
FIG. 13 is a diagram of a variable resistance memory device including a conductive pillar, according to various example embodiments.

FIG. 13 is a diagram of a variable resistance memory device 100d including a conductive pillar 126, according to various example embodiments. To compare FIG. 9 with FIG. 13, the variable resistance memory device 100d of FIG. 13 may include the conductive pillar 126 rather than an insulating pillar.

The conductive pillar 126 may contact the resistance change layer 122. The conductive pillar 126 may be conformally deposited on the resistance change layer 122. The conductive pillar 126 may include a material having an improved or excellent electrical conductive property. For example, the conductive pillar 126 may include at least one of W, Ti, TiN, Ru, RuO2, Ta, and TaN. The conductive pillar 126 may include the same material as the gate electrodes 131.

The entire area of the conductive pillar 126 may become spatially apart from the entire area of the semiconductor layer 123 by the resistance change layer 122. Because the conductive pillar 126 is electrically insulated from the semiconductor layer 123, voltages may be separately applied to the conductive pillar 126 and the semiconductor layer 123.

The variable resistance memory device 100d may further include a first bit line (not shown) electrically connected to the conductive pillar 126 and providing a voltage to the conductive pillar 126 and a second bit line (not shown) electrically insulated from the first bit line and electrically connected to the semiconductor layer 123 and providing a voltage to the semiconductor layer 123.

When the variable resistance memory device 100d operates, a voltage may also be applied to the conductive pillar 126. The voltage applied to the conductive pillar 126 may be greater than a gate voltage of a selected memory cell, that is a turn-off voltage, and may be greater than or equal to the voltage applied to the semiconductor layer 123. Thus, a horizontal electric field toward the semiconductor layer 123 may be formed in the resistance change layer 122 corresponding to the selected memory cell. Oxygen vacancies in the resistance change layer 122 corresponding to the selected memory cell may be concentrated in an area of the resistance change layer 122 that is adjacent to the semiconductor layer 123, and thus, a conductive filament may be relatively more easily formed.

Figure 14:
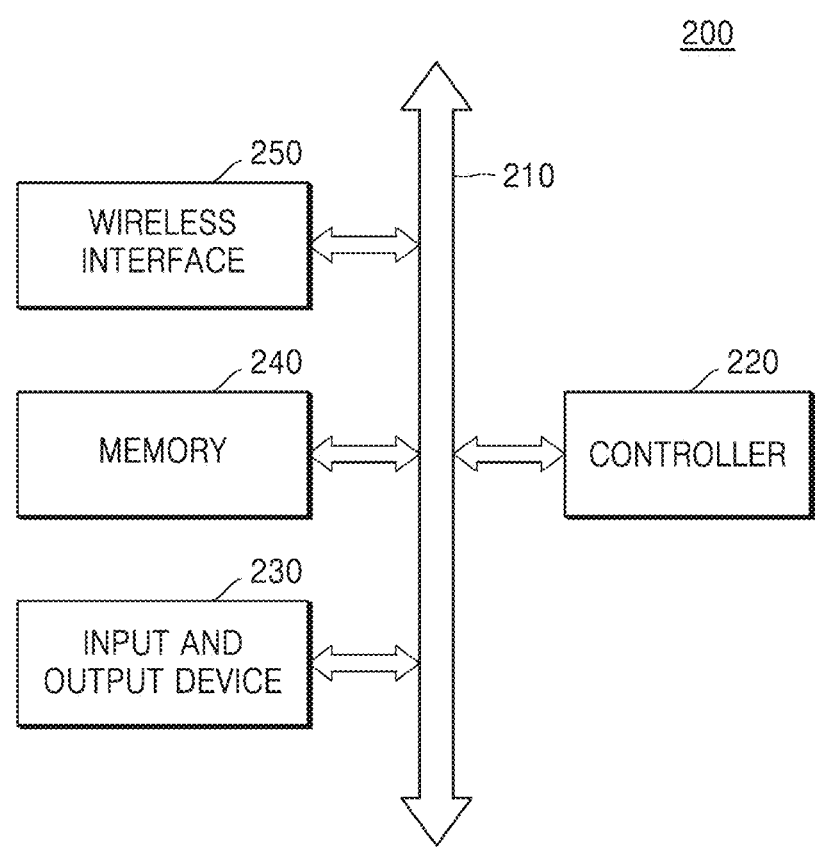
FIG. 14 is a schematic block diagram of an electronic device including a nonvolatile memory device, according to various example embodiments.

FIG. 14 is a schematic block diagram of an electronic device 200 including a nonvolatile memory device according to various example embodiments.

Referring to FIG. 14, the electronic device 200 according to various example embodiments may be one of a personal digital assistant (PDA), a laptop computer, a portable computer, a web tablet computer, a wireless telephone, a cellular phone, a digital music player, a wired or wireless electronic device, or a complex electronic device including at least two thereof. The electronic device 200 may include a controller 220, an input and output device 230, such as one or more of a keypad, a keyboard, and a display, a memory 240, and a wireless interface 250, which are connected with each other through a bus 210.

The controller 220 may include, for example, one or more microprocessors, a digital signal processor, a micro-controller, or components similar thereto. The memory 240 may be used, for example, to store instructions executed by the controller 220.

The memory 240 may be used to store user data. The memory 240 may include at least one of nonvolatile memory devices according to various example embodiments.

The electronic device 200 may use the wireless interface 250 to transmit data or receive data to or from a wireless communication network performing communication via a radio frequency (RF) signal. For example, the wireless interface 250 may include an antenna, a wireless transceiver, etc. The electronic device 200 may be used in communication interface protocols, such as the third-generation (3G) communication systems, such as one or more of CDMA, GSM, NADC, E-TDMA, WCDAM, and CDMA2000.

Figure 15:
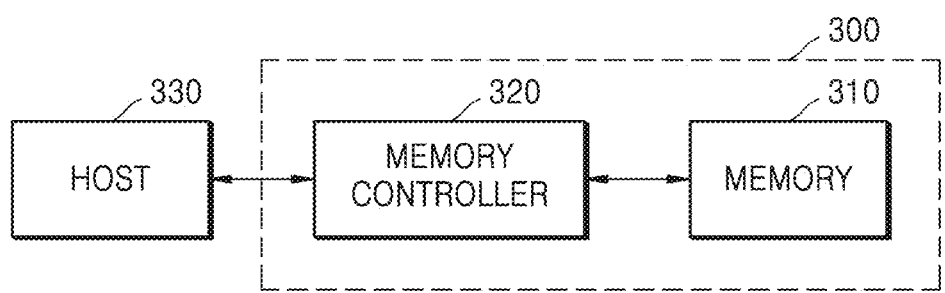
FIG. 15 is a schematic block diagram of a memory system including a nonvolatile memory device, according to various example embodiments.

FIG. 15 is a schematic block diagram of a memory system 300 including a nonvolatile memory device according to various example embodiments.

Referring to FIG. 15, nonvolatile memory devices according to various example embodiments may be used to realize the memory system 300. The memory system 300 may include a memory 310 storing a large volume of data and a memory controller 320. The memory controller 320 may control the memory 310 such that the data stored in the memory 310 may be read or written, in response to a read/write request of a host 330. The memory controller 320 may configure the host 330, for example, an address mapping table for mapping an address provided from a mobile device or a computer system into a physical address of the memory 310. The memory 310 may include at least one of semiconductor memory devices according to various example embodiments.

The nonvolatile memory device according to various example embodiments described above may be realized in the form of a chip and may be used as a neuromorphic computing platform.

Figure 16:
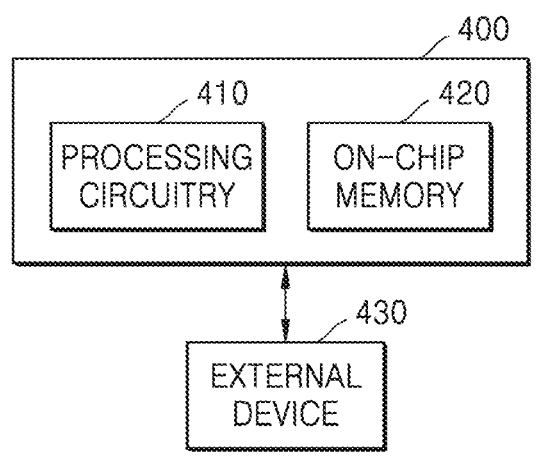
FIG. 16 is a schematic diagram of a neuromorphic apparatus, according to various example embodiments.

FIG. 16 is a schematic diagram of a neuromorphic apparatus 400 including a memory device, according to various example embodiments. Referring to FIG. 16, the neuromorphic apparatus 400 may include processing circuitry 410 and/or a memory 420. The memory 420 of the neuromorphic apparatus 400 may include the memory system according to various example embodiments.

The processing circuitry 410 may be configured to control functions for driving the neuromorphic apparatus 400. For example, the processing circuitry 410 may be configured to control the neuromorphic apparatus 400 by executing programs stored in the memory 420 of the neuromorphic apparatus 400.

The processing circuitry 410 may include hardware such as logic circuits; a hardware/software combination, such as a processor executing software; or a combination thereof. For example, a processor may include, but is not limited to, one or more of a central processing unit (CPU), a graphics processing unit (GPU), an application processor (AP) included in the neuromorphic apparatus 400, an arithmetic logic unit (ALU), a digital signal processor, a microcomputer, a field programmable gate array (FPGA), a system-on-chip (SoC), a programmable logic unit, a microprocessor, an application-specific integrated circuit (ASIC), or the like.

The processing circuitry 410 may be configured to read/write a variety of data from/in an external device 1230 and/or execute the neuromorphic apparatus 400 by using the read/written data. The external device 1230 may include an external memory and/or sensor array with an image sensor (e.g., a CMOS image sensor circuit).

The neuromorphic apparatus 400 in FIG. 16 may be applied to a machine learning system. The machine learning system may utilize a variety of artificial neural network organizational and processing models, such as one or more of convolutional neural networks (CNN), de-convolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may be used to provide various services, for example, an image classify service, a user authentication service based on bio-information or biometric data, an advanced driver assistance system (ADAS) service, a voice assistant service, an automatic speech recognition (ASR) service, or the like, and may be mounted and executed by other electronic devices.

The variable resistance memory device according to various example embodiments may operate even when a voltage, an absolute value of which is relatively small, is applied thereto.

Alternatively or additionally, the variable resistance memory device according to various example embodiments may be advantageous for realizing lower power consumption and/or higher integration.

It should be understood that various example embodiments described herein should be considered in a descriptive sense only and not for purposes of limitation. Descriptions of features or aspects within each embodiment should typically be considered as available for other similar features or aspects in other embodiments, and example embodiments are not necessarily mutually exclusive with one another.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While one or more example embodiments have been described with reference to the figures, it will be understood by one of ordinary skill in the art that various changes in form and details may be made therein without departing from the spirit and scope as defined by the following claims. Additionally example embodiments are not necessarily mutually exclusive with one another. For example, some example embodiments may include one or more features described with reference to one or more figures, and may also include one or more other features described with reference to one or more other figures.

What is claimed is:

1. A variable resistance memory device comprising:
a resistance change layer comprising a metal oxide that includes a first metal element and a second metal element, the metal oxide having an oxygen deficient ratio greater than or equal to about 9%;
a semiconductor layer on the resistance change layer;
a gate insulating layer on the semiconductor layer; and
a plurality of electrodes on the gate insulating layer to be apart from each other.

2. The variable resistance memory device of claim 1, wherein a content of the first metal element with respect to an entire metal of the resistance change layer is greater than or equal to about 50 at %.

3. The variable resistance memory device of claim 1, wherein a content of the second metal element with respect to an entire metal of the resistance change layer is less than or equal to about 35 at %.

4. The variable resistance memory device of claim 1, wherein the first metal element comprises at least one of Ta, Ti, Sn, Cr, and Mn.

5. The variable resistance memory device of claim 1, wherein the second metal element comprises at least one of Hf, Al, Nb, La, Zr, Sc, W, V, and Mo.

6. The variable resistance memory device of claim 1, wherein the resistance change layer further comprises Si.

7. The variable resistance memory device of claim 1, wherein the semiconductor layer is configured to receive a write voltage having an absolute value less than or equal to about 4V is applied thereto.

8. The variable resistance memory device of claim 1, further comprising:
an oxide layer between the semiconductor layer and the resistance change layer.

9. The variable resistance memory device of claim 8, wherein a thickness of the oxide layer is less than a thickness of the resistance change layer.

10. The variable resistance memory device of claim 1, wherein
the resistance change layer comprises a first resistance change layer and a second resistance change layer sequentially arranged in a direction away from the semiconductor layer; and
an oxygen deficient ratio of the first resistance change layer is greater than an oxygen deficient ratio of the second resistance change layer.

11. The variable resistance memory device of claim 1, wherein
at least three of the plurality of gate electrodes are arranged periodically, and a pitch of the at least three of the plurality of gate electrodes is less than or equal to about 20 nm.

12. The variable resistance memory device of claim 1, further comprising:
a pillar,
wherein the resistance change layer, the semiconductor layer, and the gate insulating layer sequentially surround the pillar in a shell shape, and the plurality of gate electrodes and an insulating element surround the gate insulating layer in a shell shape.

13. The variable resistance memory device of claim 12, wherein the pillar comprises an insulating material.

14. The variable resistance memory device of claim 12, wherein the pillar comprises a conductive material.

15. The variable resistance memory device of claim 14, wherein the pillar is configured to receive a voltage that is greater than or equal to a voltage applied to the semiconductor layer.

16. A variable resistance memory device comprising:
a resistance change layer comprising silicon and comprising a metal oxide having an oxygen deficient ratio that is greater than or equal to about 9%;
a semiconductor layer on the resistance change layer;
a gate insulating layer on the semiconductor layer; and
a plurality of electrodes on the gate insulating layer to be apart from each other.

17. The variable resistance memory device of claim 16, wherein the resistance change layer comprises at least one of Ta, Ti, Sn, Cr, and Mn.

18. The variable resistance memory device of claim 16, wherein a content of silicon with respect to a sum of metals and silicon of the resistance change layer is less than or equal to about 35 at %.

19. A variable resistance memory device comprising:
a resistance change layer comprising a first metal oxide having an oxygen deficient ratio that is greater than or equal to about 9% and a second metal oxide having an oxygen deficient ratio that is less than 9%, wherein a content of the first metal oxide is greater than a content of the second metal oxide;
a semiconductor layer on the resistance change layer;
a gate insulating layer on the semiconductor layer; and
a plurality of gate electrodes on the gate insulating layer to be apart from each other.

20. The variable resistance memory device of claim 19, wherein a content of a metal included in the second metal oxide with respect to entire metal included in the resistance change layer is less than or equal to about 35 at %.

* * * * *